(12) United States Patent
Fukudome et al.

(10) Patent No.: US 11,009,559 B2
(45) Date of Patent: May 18, 2021

(54) LEAKAGE CURRENT CALCULATION METHOD

(71) Applicant: OMRON Corporation, Kyoto (JP)

(72) Inventors: Takuya Fukudome, Aso (JP); Tsuyoshi Takeuchi, Kusatsu (JP); Koji Yokota, Shiga (JP); Tomohiro Yamada, Shiga (JP)

(73) Assignee: OMRON Corporation, Kyoto (JP)

( * ) Notice: Subject to any disclaimer, the term of this patent is extended or adjusted under 35 U.S.C. 154(b) by 49 days.

(21) Appl. No.: 16/490,599

(22) PCT Filed: Feb. 19, 2018

(86) PCT No.: PCT/JP2018/005804
§ 371 (c)(1),
(2) Date: Sep. 3, 2019

(87) PCT Pub. No.: WO2018/193703
PCT Pub. Date: Oct. 25, 2018

(65) Prior Publication Data
US 2020/0003820 A1  Jan. 2, 2020

(30) Foreign Application Priority Data

Apr. 21, 2017 (JP) .............................. JP2017-084357

(51) Int. Cl.
*G01R 31/52* (2020.01)
(52) U.S. Cl.
CPC ................................... *G01R 31/52* (2020.01)

(58) Field of Classification Search
CPC ....................................................... G01R 31/50
See application file for complete search history.

(56) References Cited

U.S. PATENT DOCUMENTS

2015/0311862 A1  10/2015 Lee
2020/0200832 A1*  6/2020 Takeuchi ............... G01R 31/52

FOREIGN PATENT DOCUMENTS

| CN | 1144338 | 3/1997 |
| CN | 1617434 | 5/2005 |
| CN | 101663589 | 3/2010 |
| CN | 102306924 | 1/2012 |
| CN | 103995208 | 8/2014 |

(Continued)

OTHER PUBLICATIONS

Eikichi Osaki, "Thorough Examination of Trouble in Electric Fields", Shin-denki (New electricity), Feb. 2000, pp. 46-51.

(Continued)

*Primary Examiner* — Clayton E. LaBalle
*Assistant Examiner* — Michael A Harrison
(74) *Attorney, Agent, or Firm* — JCIPRNET

(57) ABSTRACT

An insertion determination unit (16) for precisely calculating a ground insulation resistance component of a leakage current regardless of the presence or absence of an inverter determines whether an inverter (3) is inserted between a commercial power system (2) and a three-phase motor (5). A resistance component leakage current calculation unit (18) calculates a ground insulation resistance component of a leakage current on the basis of a calculation procedure corresponding to the result of the above determination.

4 Claims, 15 Drawing Sheets

(56) References Cited

FOREIGN PATENT DOCUMENTS

| | | |
|---|---|---|
| CN | 105264393 | 1/2016 |
| JP | 2011-153910 | 8/2011 |
| JP | 2012-251817 | 12/2012 |
| JP | 5631444 | 11/2014 |
| JP | 2014-228519 | 12/2014 |
| TW | 201621331 | 6/2016 |
| WO | 2006035519 | 4/2006 |
| WO | 2016047057 | 3/2016 |
| WO | 2017154271 | 9/2017 |

OTHER PUBLICATIONS

"International Search Report (Form PCT/ISA/210) of PCT/JP2018/005804," dated May 15, 2018, with English translation thereof, pp. 1-4.

"Written Opinion (Form PCT/ISA/237) of PCT/JP2018/005804," dated May 15, 2018, with English translation thereof, pp. 1-6.

"Office Action of Taiwan Counterpart Application", with English translation thereof, dated Aug. 23, 2018, p. 1-p. 8.

"Office Action of China Counterpart Application", dated Jan. 6, 2021, with English translation thereof, pp. 1-14.

* cited by examiner (a)

(b)

(a)

(b)

(a)

(b)

(a)

(b)

LEAKAGE CURRENT CALCULATION METHOD

CROSS-REFERENCE TO RELATED APPLICATION

This application is a 371 application of the International PCT application serial no. PCT/JP2018/005804, filed on Feb. 19, 2018, which claims priority benefits of Japan Patent Application No. 2017-084357 filed on Apr. 21, 2017. The entirety of each of the above-mentioned patent applications is hereby incorporated by reference herein and made a part of this specification.

BACKGROUND

Technical Field

The disclosure relates to a leakage current calculation device and a leakage current calculation method for calculating a leakage current.

Description of Related Art

Examples of techniques for calculating a leakage current in a load such as a three-phase motor are disclosed in Non-Patent Document 1 and Patent Document 1. The technique of Non-Patent Document 1 is intended to precisely measure a ground insulation resistance component leakage current in a facility in which an inverter is not used in driving a load such as a three-phase motor. On the other hand, the technique of Patent Document 1 is intended to precisely measure a ground insulation resistance component leakage current in a facility in which an inverter is used in driving a load.

CITATION LIST

Non-Patent Document

[Non-Patent Document 1] Eikichi Osaki, "Thorough Examination of Trouble in Electric Fields", published in the February 2000 issue of Shin-denki (New electricity), Ohm-sha, Ltd., p. 46 to 51

Patent Document

[Patent Document 1] Japanese Patent Laid-Open No. 2014-228519 (published in Dec. 8, 2014)

SUMMARY

Problems to be Solved by the Invention

As disclosed in Non-Patent Document 1 and Patent Document 1, in the past, the configurations of devices that calculate a ground insulation resistance component leakage current have differed depending on the presence or absence of an inverter. Therefore, the related art has a problem in that different leakage current calculation devices need to be used depending on whether an inverter is used in a facility. The related art further has a problem in that, in a case where an inverter is newly added to a facility in which an inverter is not used for the purpose of energy saving or the like, a leakage current calculation device needs to be changed accordingly.

The disclosure was contrived in order to solve the above problem. The disclosure provides a leakage current calculation device and a leakage current calculation method that make it possible to precisely calculate a ground insulation resistance component leakage current regardless of the presence or absence of an inverter.

Means for Solving the Problem

According to an aspect of the disclosure, in order to solve the above problem, there is provided a leakage current calculation device including: a voltage measurement unit that measures at least one of line voltages in a three-phase AC type commercial power system to which one of three different phases is grounded; a ground voltage calculation unit that calculates a ground voltage between a neutral point and an earth of the commercial power system from the at least one line voltage measured by the voltage measurement unit; a leakage current measurement unit that measures a leakage current that flows between a load connected to the commercial power system and the earth; a frequency component extraction unit that extracts a frequency component that is synchronized with a system frequency of the commercial power system from the measured leakage current; a phase difference decision unit that decides a phase difference between the calculated ground voltage and the extracted frequency component; an insertion determination unit that determines whether an inverter is inserted between the commercial power system and the load; and a leakage current calculation unit that calculates a ground insulation resistance component leakage current of the system frequency portion that flows between the load and the earth through ground insulation resistance of the load on the basis of a calculation procedure corresponding to a result of determination of the insertion determination unit.

According to an aspect of the disclosure, in order to solve the above problem, there is provided a leakage current calculation method including: a voltage measurement step of measuring at least one of line voltages in a three-phase AC type commercial power system to which one of three different phases is grounded; a ground voltage calculation step of calculating a ground voltage between a neutral point and an earth of the commercial power system from the measured at least one line voltage; a leakage current measurement step of measuring a leakage current that flows between a load connected to the commercial power system and the earth; a frequency component extraction step of extracting a frequency component that is synchronized with a system frequency of the commercial power system from the measured leakage current; a phase difference decision step of deciding a phase difference between the calculated ground voltage and the extracted frequency component; an insertion determination step of determining whether an inverter is inserted between the commercial power system and the load; and a leakage current calculation step of calculating a ground insulation resistance component leakage current of the system frequency portion that flows between the load and the earth through ground insulation resistance of the load on the basis of a calculation procedure corresponding to a result of determination in the insertion determination step.

Effect of the Invention

According to the disclosure, it is possible to precisely calculate a ground insulation resistance component leakage current regardless of the presence or absence of an inverter.

DESCRIPTION OF THE EMBODIMENTS

Embodiment 1

Embodiment 1 according to the disclosure will be described below with reference to FIG. 1 to FIG. 13.

(First Configuration Example)

Figure 2:
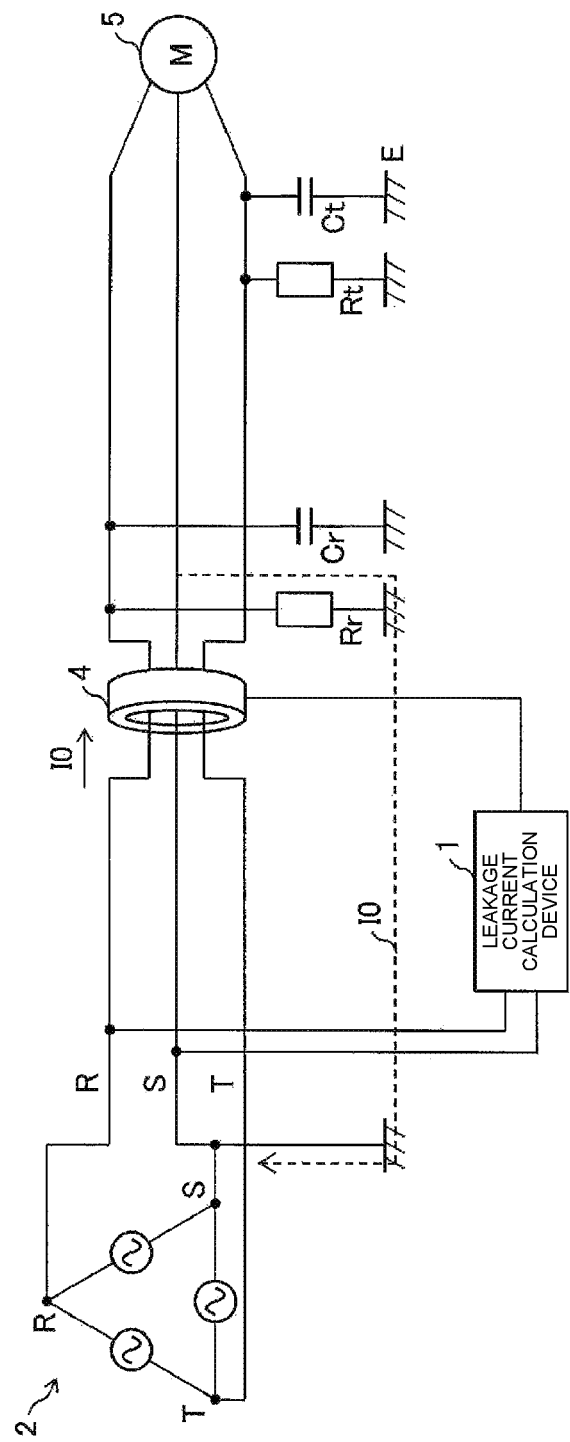
FIG. 2 is an outline system diagram illustrating a first configuration example to which the leakage current calculation device according to Embodiment 1 of the disclosure is applied.

FIG. 2 is an outline system diagram illustrating a first configuration example to which a leakage current calculation device 1 according to Embodiment 1 of the disclosure is applied. In the example shown in this drawing, the leakage current calculation device 1 is configured to monitor a three-phase motor 5 (load) that drives a commercial power system 2 as a power source.

The commercial power system 2 is a three-phase AC type alternating-current power source in which an S-phase of three different phases (an R-phase, an S-phase, and a T-phase) is grounded to the earth E. The three phases are connected to the input sides of the three-phase motor 5, respectively, through an R-line, an S-line, and a T-line. The three-phase motor 5 operates using a voltage supplied from the commercial power system 2.

A zero-phase current transformer 4 surrounding the R-line, the S-line, and the T-line is provided between the commercial power system 2 and the three-phase motor 5. The zero-phase current transformer 4 measures a three-phase synthesized ground zero-phase current I0 that flows between the commercial power system 2 and the three-phase motor 5. Although this will be described later in detail, this zero-phase current I0 is equal to a leakage current that flows between the three-phase motor 5 and the earth E.

(Second Configuration Example)

Figure 3:
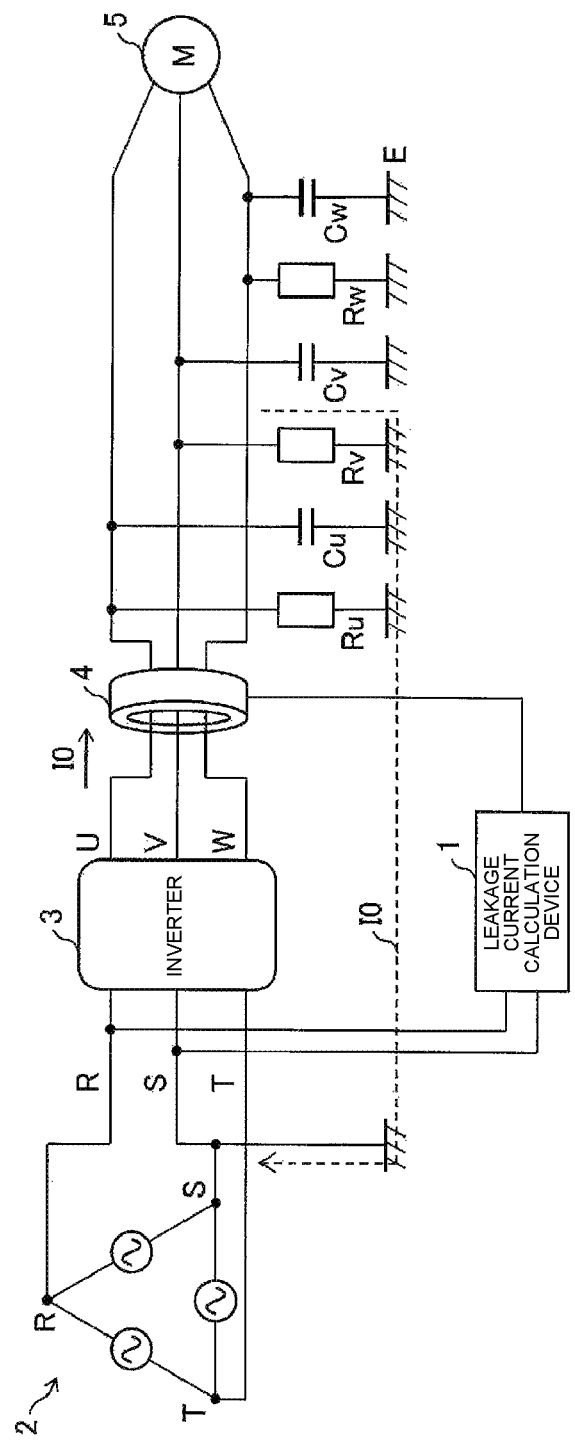
FIG. 3 is an outline system diagram illustrating a second configuration example to which the leakage current calculation device according to Embodiment 1 of the disclosure is applied.

FIG. 3 is an outline system diagram illustrating a second configuration example to which the leakage current calculation device 1 according to Embodiment 1 of the disclosure is applied. In the example shown in this drawing, the leakage current calculation device 1 is configured to monitor the three-phase motor 5 (load) that is driven by an inverter 3 using the commercial power system 2 as a power source.

The commercial power system 2 is a three-phase AC type alternating-current power source in which an S-phase of three different phases (an R-phase, an S-phase, and a T-phase) is grounded to the earth E. The three phases are connected to the input sides of the inverter 3, respectively, through the R-line, the S-line, and the T-line.

The inverter 3 generates predetermined control voltages from three-phase power that is supplied from the commercial power system 2, and outputs the generated control voltages to the three-phase motor 5 through three lines (a U-line, a V-line, and a W-line) corresponding to three phases (a U-phase, a V-phase, and a W-phase) on the output sides. The three-phase motor 5 is connected to the output sides of the inverter 3, and operates using each of the supplied control voltages.

The zero-phase current transformer 4 surrounding the U-line, the V-line, and the W-line is provided between the inverter 3 and the three-phase motor 5. The zero-phase current transformer 4 measures the three-phase synthesized ground zero-phase current I0 that flows between the inverter 3 and the three-phase motor 5. Although this will be described later in detail, this zero-phase current I0 is equal to a leakage current that flows between the three-phase motor 5 and the earth E.

In the configuration shown in FIG. 2, the inverter 3 is not inserted between the commercial power system 2 and the three-phase motor 5. On the other hand, in the configuration shown in FIG. 3, the inverter 3 is inserted between the commercial power system 2 and the three-phase motor 5. The leakage current calculation device 1 can be applied to not only a configuration in which the inverter 3 is inserted but also a configuration in which the inverter is not inserted.

(Configuration of Leakage Current Calculation Device 1)

Figure 1:
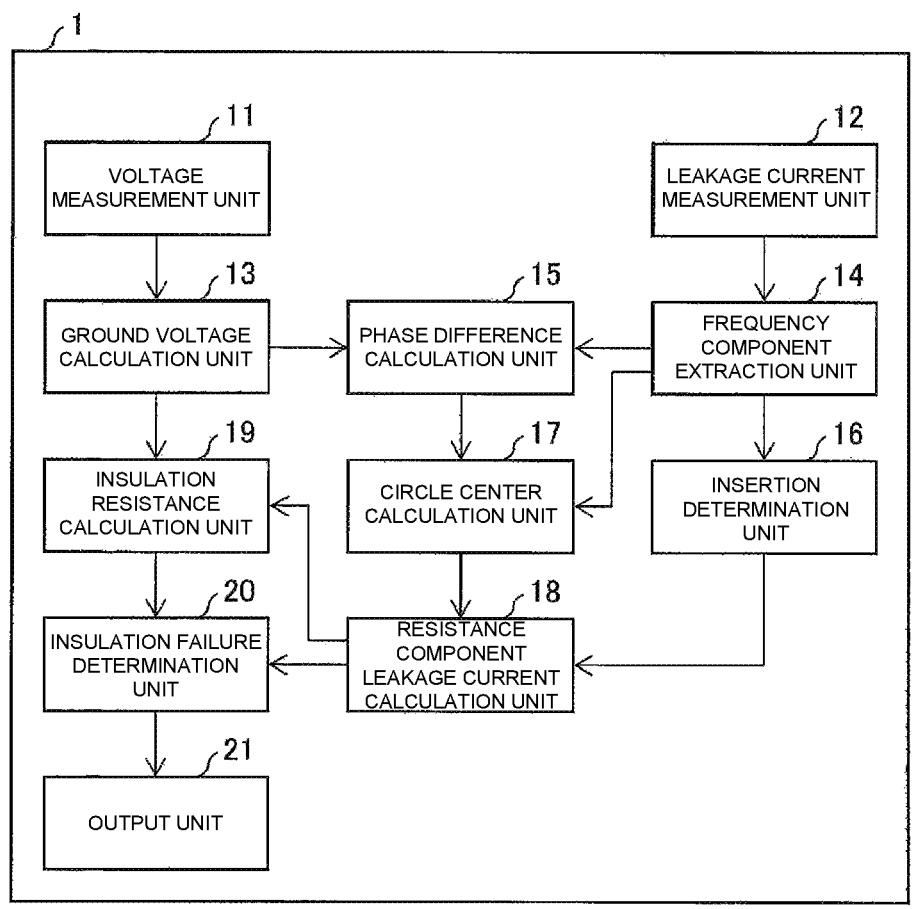
FIG. 1 is a block diagram illustrating main components of a leakage current calculation device according to Embodiment 1 of the disclosure.

FIG. 1 is a block diagram illustrating main components of the leakage current calculation device according to Embodiment 1 of the disclosure. As shown in this drawing, the leakage current calculation device 1 includes a voltage measurement unit 11, a leakage current measurement unit 12, a ground voltage calculation unit 13, a frequency component extraction unit 14, a phase difference calculation unit 15 (a phase difference decision unit), an insertion determination unit 16, a circle center calculation unit 17, a resistance component leakage current calculation unit 18 (a leakage current calculation unit), an insulation resistance calculation unit 19, an insulation failure determination unit 20 (an insulation deterioration load specification unit, an insulation deterioration determination unit), and an output unit 21.

The voltage measurement unit 11 measures at least one of line voltages of the commercial power system 2. In the configuration shown in FIG. 2, the voltage measurement unit 11 measures a line voltage on the output side of the commercial power system 2. In the configuration shown in FIG. 3, the voltage measurement unit 11 measures a line voltage on the input side of the inverter 3. In the present embodiment, in the cases of both the configuration of FIG. 2 and the configuration of FIG. 3, a line voltage between the R-phase and the S-phase is measured. Meanwhile, the line voltage to be measured is not limited thereto and may be any line voltage. For example, the voltage measurement unit 11 may measure a voltage between the R-phase and the T-phase or a voltage between the T-phase and the S-phase. Meanwhile, the voltage measurement unit 11 may have a low-pass filter or a bandpass filter for removing a high-frequency component or extracting a system frequency component from the measured voltage.

The ground voltage calculation unit 13 calculates a ground voltage between a neutral point and the earth E of the commercial power system 2 from at least one of the line voltages measured by the voltage measurement unit 11. In the present embodiment, a ground voltage is calculated from the line voltage between R-S.

The leakage current measurement unit 12 measures a leakage current (a zero-phase current) that flows between the three-phase motor 5 and the earth E through the zero-phase current transformer 4. The leakage current measurement unit 12 may have a low-pass filter or a bandpass filter for removing a high-frequency component or extracting a system frequency component from the measured leakage current.

The frequency component extraction unit 14 extracts at least one frequency component including a frequency component synchronized with the system frequency of the commercial power system 2 (that is, a frequency component of the same frequency as the system frequency) from the measured leakage current. A DFT, an FFT or the like, for example, may be used in this extraction process.

The phase difference calculation unit 15 calculates a phase difference between the measured line voltage or the calculated ground voltage and the extracted frequency component of the system frequency. The calculation of a phase difference is performed by, for example, an arithmetic operation process, but instead, a phase difference may be decided by measuring a phase difference using a predetermined measurement circuit.

The insertion determination unit 16 determines whether the inverter 3 is inserted between the commercial power system 2 and the three-phase motor 5. In the present embodiment, the insertion determination unit 16 determines the presence or absence of the insertion of the inverter 3 on the basis of the at least one frequency component extracted from the leakage current by the frequency component extraction unit 14. The details of determination will be described later.

The circle center calculation unit 17 calculates the central point of a circle that is drawn by each point specified by the frequency components of the system frequency calculated at at least three different points in time and the decided phase difference.

The resistance component leakage current calculation unit 18 calculates a current that flows between the three-phase motor 5 and the earth E through the ground insulation resistance of the three-phase motor 5 (a ground insulation resistance component leakage current of a system frequency portion) on the basis of the calculated central point of the circle.

The insulation resistance calculation unit 19 calculates the ground insulation resistance of the three-phase motor 5 using the calculated ground insulation resistance component leakage current of a system frequency portion and the measured line voltage or the calculated ground voltage. In the insulation resistance calculation unit 19, a line voltage is used in a case where the inverter 3 is not inserted, and a ground voltage is used in a case where the inverter is inserted.

The insulation failure determination unit 20 determines the presence or absence of an insulation failure of the three-phase motor 5 on the basis of the calculated ground insulation resistance component leakage current of a system frequency portion or the ground insulation resistance.

The output unit 21 outputs the result of determination of the insulation failure in a desired form to the outside of the leakage current calculation device 1. This output is performed as, for example, screen display, communication output, or contact signal output.

(Calculation of Line Voltage, Leakage Current and Ground Insulation Resistance in First Configuration)

In a case where the inverter 3 is not inserted, in the leakage current calculation device 1, a value measured by the voltage measurement unit 11 is used as a line voltage, and a value measured by the current measurement unit 12 is used as a leakage current. The leakage current calculation device 1 further calculates a resistance component leakage current I0r using a method disclosed in Non-Patent Document 1 or a method disclosed in Japanese Patent Laid-Open No. 2013-195023. The leakage current calculation device 1 can calculate ground insulation resistance R0=Vrs/I0r by using the calculated line voltage Vrs and resistance component leakage current I0r.

(Calculation of Ground Voltage in Second Configuration)

Figure 4:
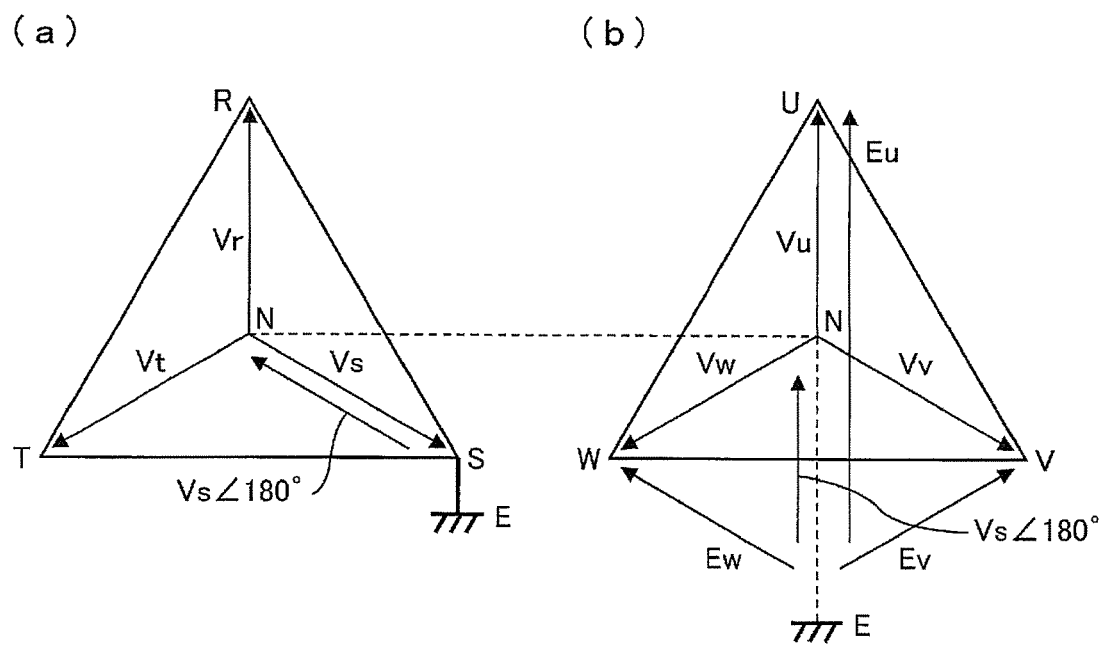
FIG. 4 is a diagram illustrating a principle for calculating a ground voltage of a commercial power system in Embodiment 1 of the disclosure in a case where an inverter is inserted between a commercial power system and a three-phase motor.

FIG. 4 is a diagram illustrating a principle for calculating the ground voltage of the commercial power system 2 in Embodiment 1 of the disclosure in a case where the inverter 3 is inserted between the commercial power system 2 and the three-phase motor 5. The leakage current calculation device 1 of the present embodiment calculates a voltage (ground voltage) that is applied to the ground insulation resistance of the three-phase motor 5 in order to calculate the ground insulation resistance of the three-phase motor 5 connected to the commercial power system 2 through the inverter 3. A method of calculating this ground voltage will be described below with reference to FIG. 4.

The ground voltage that is applied to the ground insulation resistance of the three-phase motor 5 is equal to a voltage between a neutral point (an N-phase) of the commercial power system 2 and the earth E. In the commercial power system 2, as shown in (a) of FIG. 4, the S-phase (the S-line) is grounded. Since the voltage of the S-phase based on the neutral point is a system voltage Vs between the N-phase and the S-phase, a voltage between the N-phase and the earth E is a voltage Vs∠180° that is phase-inverted by 180° with respect to the system voltage Vs.

On the other hand, as shown in (b) of FIG. 4, the potential at the neutral point N of the inverter 3 is equal to the potential at the neutral point N of the commercial power system 2. Therefore, a voltage between the neutral point N of the inverter 3 and the earth E is also equal to the ground voltage Vs∠180° of the commercial power system 2. In addition, as shown in (b) of FIG. 4, a ground voltage Eu of the U-phase is a voltage Vu between the N-phase and the U-phase plus Vs∠180°. A ground voltage Ev of the V-phase is a voltage Vv between the N-phase and the V-phase plus Vs∠180°. A ground voltage Ew of the W-phase is a voltage Vw between the N-phase and the W-phase plus Vs∠180°. That is, relations of Eu=Vu+Vs∠180°, Ev=Vv+Vs∠180°, and Ew=Vw+Vs∠180° are established.

Here, the voltage Vu of the U-phase, the voltage Vv of the V-phase, and the voltage Vw of the W-phase are mutually phase-shifted by 120°, and thus have characteristics in which the sum of all the voltages of the respective phases is zero. That is, a relation of Vu+Vv+Vw=0 is established. Therefore, the voltage Vs∠180° is a ground voltage of the system frequency portion of the commercial power system 2 that is applied to the ground insulation resistance of the three-phase motor 5.

As shown in (a) of FIG. 4, the R-S line voltage is a vector sum of the ground voltage Vs and a voltage Vr between the neutral point (N-phase) and the R-phase. The ground voltage calculation unit 13 can calculate the system voltage Vs of the commercial power system 2 by dividing the measured R-S line voltage by √3. The system voltage Vs and the ground voltage Vs∠180° are voltages that are equal to each other in effective value and are mutually phase-shifted by 180°. Therefore, the ground voltage calculation unit 13 can calculate the ground voltage Vs∠180° by shifting the calculated phase of the system voltage Vs by 180°.

(Leakage Current in Second Configuration)

Figure 5:
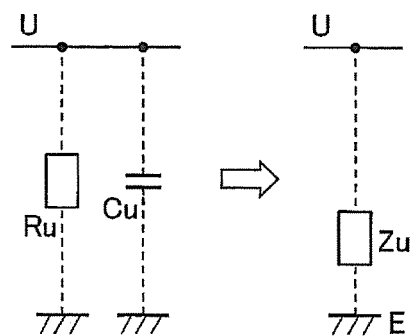
FIG. 5 is a diagram illustrating a leakage current that flows between a three-phase motor and the earth E in Embodiment 1 of the disclosure in a case where the inverter is inserted between the commercial power system and the three-phase motor.
Figure 5:
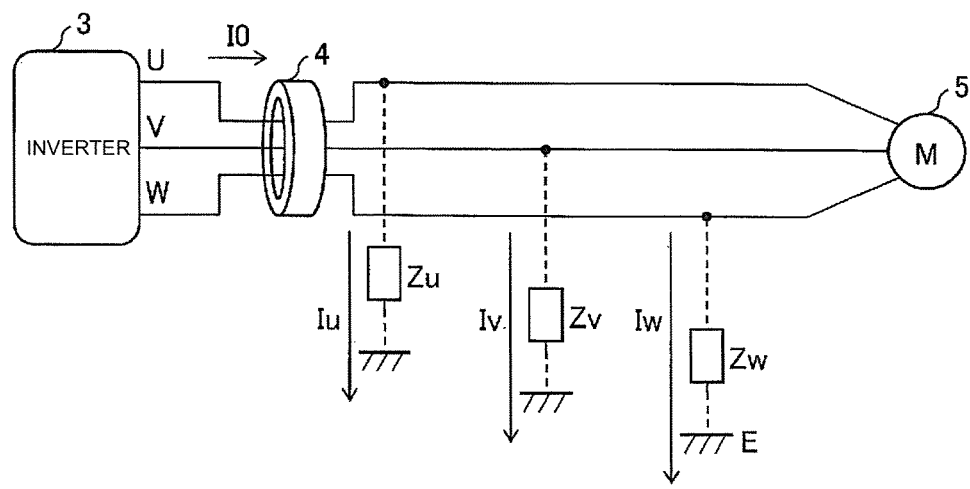

FIG. 5 is a diagram illustrating a leakage current that flows between the three-phase motor 5 and the earth E in Embodiment 1 of the disclosure in a case where the inverter 3 is inserted.

The ground insulation resistance and ground floating capacitance of the three-phase motor 5 are impedance components located between the wiring or coil of the three-phase motor 5 and the earth E. These are connected in parallel to each other. Therefore, as shown in (a) of FIG. 5, both ground insulation resistance Ru and ground floating capacitance Cu located between U-phase and the earth E on the output side of the inverter 3 are components constituting impedance Zu located between the U-phase and the earth E.

Similarly, both ground insulation resistance Rv and ground floating capacitance Cv located between the V-phase and the earth E are components constituting impedance Zv located between the V-phase and the earth E. In addition, both ground insulation resistance Rw and ground floating capacitance Cw located between the W-phase and the earth E are components constituting impedance Zw located between the W-phase and the earth E.

As shown in (b) of FIG. 5, leakage currents flow through the respective phases on the output side of the inverter 3. Specifically, a leakage current Iu flows through the U-phase, a leakage current Iv flows through the V-phase, and a leakage current Iw flows through the W-phase. The zero-phase current I0 that flows through the output side of the inverter 3b is equal to the sum of leakage currents of the respective phases. Therefore, a relation of I0=Iu+Iv+Iw is established.

When attention is focused on the system frequency component, the ground voltage Vs∠180° is applied in the same phase to the respective phases (U, V, W) on the output side of the inverter 3. For this reason, relations of Iu=Vs∠180°/Zu, Iv=Vs∠180°/Zv, and Iw=Vs∠180°/Zw are established. Therefore, a relation of I0=Vs∠180°/(1/Zu+1/Zv+1/Zw) is established.

As described above, the zero-phase current I0 that is measured through the zero-phase current transformer 4 is equal to a leakage current that flows through the synthetic impedance of the three-phase motor 5. Therefore, hereinafter, a leakage current may be denoted by a leakage current I0.

(Ground Insulation Resistance in Second Configuration)

Figure 6:
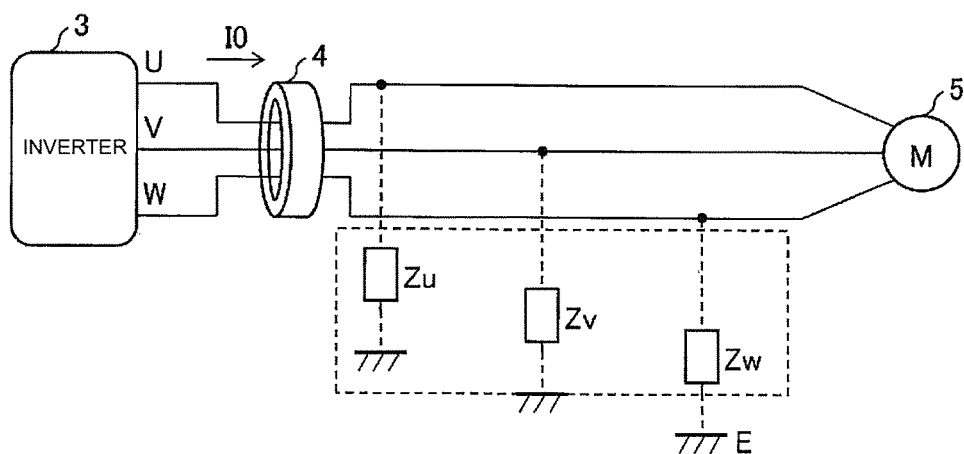
FIG. 6 is a diagram illustrating ground insulation resistance between the three-phase motor and the earth E in Embodiment 1 of the disclosure in a case where the inverter is inserted between the commercial power system and the three-phase motor.
Figure 6:
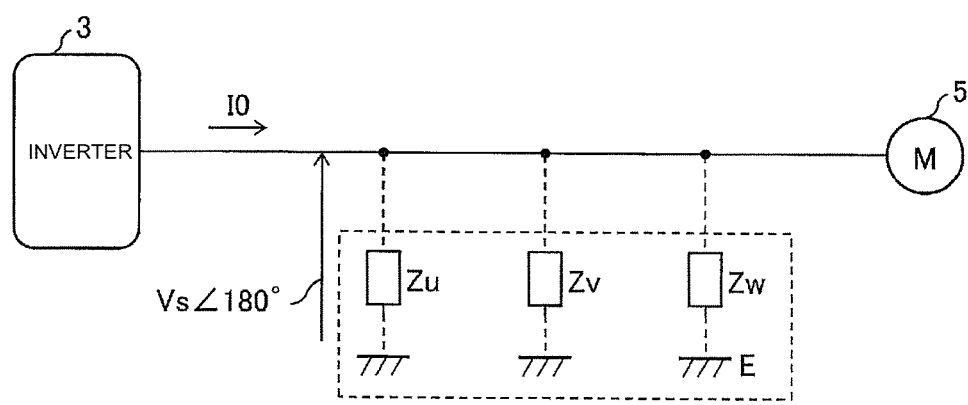

FIG. 6 is a diagram illustrating ground insulation resistance between the three-phase motor 5 and the earth E in Embodiment 1 of the disclosure in a case where the inverter 3 is inserted.

When attention is focused on the system frequency component, the ground voltage Vs∠180° is applied in the same phase to the respective phases (U, V, W) on the output side of the inverter 3. This can be considered to amount to Zu, Zv, and Zw being connected in parallel to a common bus to which the ground voltage Vs∠180° is applied. Therefore, when the synthetic impedance between the three-phase motor 5 and the earth E is set to Z0, a relation of 1/Z0=1/Zu+1/Zv+1/Zw is established. Rearranging this expression forms a relation of I0=Vs∠180°/Z0, and thus a relation of Z0=Vs∠180°/I0 is established.

The ground synthetic impedance Z0 includes, as components, the ground insulation resistance and the ground floating capacitance of the three-phase motor 5 that are connected in parallel to each other. Therefore, when a phase difference between the zero-phase current I0 and the ground voltage Vs∠180° is set to θ, a current I0r that flows through the ground insulation resistance of Z0 is I0×cos θ. On the other hand, a current I0c that flows through the ground floating capacitance of Z0 is I0×sin θ.

Thereby, the ground insulation resistance R0 of the three-phase motor 5 is calculated as R0=Vs∠180°/I0r. On the other hand, the capacitive reactance C0 of the ground floating capacitance of the three-phase motor 5 is calculated as C0=Vs∠180°/I0c.

(Process Flow)

Figure 7:
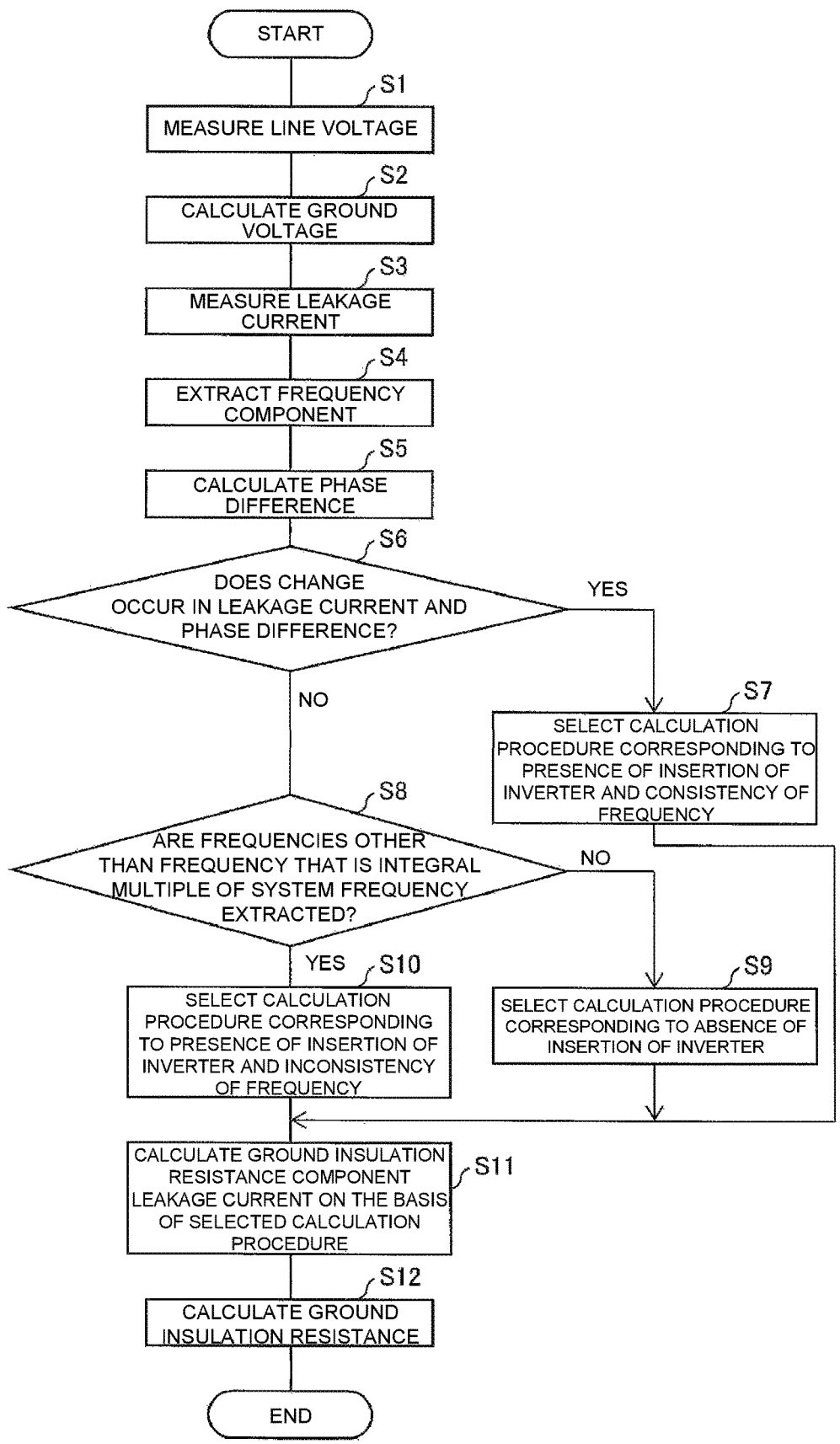
FIG. 7 is a flow chart illustrating a flow of a series of processes for the leakage current calculation device according to Embodiment 1 of the disclosure to calculate a ground insulation resistance component leakage current on the basis of a calculation procedure corresponding to the presence or absence of insertion of an inverter and the consistency/inconsistency of a frequency.

FIG. 7 is a flow chart illustrating a flow of a series of processes for the leakage current calculation device 1 according to Embodiment 1 of the disclosure to calculate a ground insulation resistance component leakage current on the basis of a calculation procedure corresponding to the presence or absence of insertion of an inverter and the consistency/inconsistency of a frequency.

In step S1, the voltage measurement unit 11 measures a line voltage between the R-phase and the S-phase. In step S2, the ground voltage calculation unit 13 calculates a ground voltage on the basis of the measured line voltage. In step S3, the leakage current measurement unit measures a leakage current through the zero-phase current transformer 4. In step S4, the frequency component extraction unit 14 extracts at least one frequency component including the frequency component of the system frequency from the measured leakage current. In a case where the inverter 3 is not inserted, the frequency component extraction unit 14 extracts only the frequency component of the system frequency of the commercial power system 2 from the leakage current. On the other hand, in a case where the inverter 3 is inserted, the frequency component of the system frequency, the frequency component of an operating frequency, and the frequency component of a frequency that is the integral multiple of the operating frequency are extracted. An FFT or a DFT, for example, is used in a process of extracting these frequency components.

In steps S6 to S10, the insertion determination unit 16 automatically determines a calculation procedure corresponding to the presence or absence of insertion of an inverter and the consistency/inconsistency of a frequency. In other words, the insertion determination unit 16 does not require, for example, a user's input from the outside of the leakage current calculation device 1 (input of information for designating a calculation procedure corresponding to the presence or absence of insertion of an inverter and the consistency/inconsistency of a frequency) in order to determine the calculation procedure corresponding to the presence or absence of insertion of an inverter and the consistency/inconsistency of a frequency. Therefore, it is possible to determine a calculation procedure corresponding to the presence or absence of insertion of an inverter and the consistency/inconsistency of a frequency without a user spending much time or effort to use the leakage current calculation device 1. Meanwhile, the insertion determination unit 16 can also determine a calculation procedure corresponding to the presence or absence of insertion of an inverter and the consistency/inconsistency of a frequency on the basis of input from the outside of the leakage current calculation device 1. In this case, the leakage current calculation device 1 can also accurately determine a calculation procedure corresponding to the presence or absence of insertion of an inverter and the consistency/inconsistency of a frequency.

In step S6, the resistance component leakage current calculation unit 18 determines the presence or absence of the leakage current I0 measured at any point in time and a change in the calculated phase difference θ. In the case of NO in step S6, the resistance component leakage current calculation unit 18 selects, in step S7, a calculation procedure for calculating a ground insulation resistance component leakage current which corresponds to the presence of insertion of an inverter and the consistency of a frequency.

In the case of YES in step S6, the insertion determination unit 16 determines, in step S8, the presence or absence of frequencies other than a frequency that is the integral multiple of the system frequency. In the case of NO in step S8, the insertion determination unit 16 selects, in step S9, a calculation procedure for calculating a ground insulation resistance component leakage current which corresponds to the absence of insertion of an inverter. In a case where the system frequency is 60 Hz, the insertion determination unit 16 selects a calculation procedure corresponding to the absence of insertion of an inverter, for example, in a case where each frequency component of 60 Hz, 120 Hz, and 180 Hz is extracted. Frequencies extracted in this case are not limited to these three, and other frequencies such as, for example, 240 Hz, 300 Hz, . . . can also be extracted. On the other hand, in the case of YES in step S8, the insertion determination unit 16 selects, in step S10, a calculation procedure for calculating a ground insulation resistance component leakage current which corresponds to the presence of insertion of an inverter and the inconsistency of a frequency. The insertion determination unit 16 selects a calculation procedure corresponding to the presence of insertion of an inverter and the inconsistency of a frequency, for example, in a case where each frequency component of 50 Hz, 60 Hz, 100 Hz, 120 Hz, 150 Hz, and 180 Hz is extracted.

In step S11, the resistance component leakage current calculation unit 18 calculates a ground insulation resistance component leakage current on the basis of a calculation procedure selected in any of steps S7, S9, or S10. In step S12, the insulation failure determination unit 20 calculates the ground insulation resistance of the three-phase motor 5 on the basis of the calculated ground insulation resistance component leakage current.

(Calculation Procedure in Case of Absence of Insertion of Inverter 3)

A calculation procedure of a ground insulation resistance component leakage current which is selected in a case where the inverter 3 is not inserted is a calculation procedure based on the relational expression of $I0R=I0\times(\cos\theta+1/\sqrt{3}\times\sin\theta)$. In this expression, I0R is a ground insulation resistance component leakage current. I0 is a frequency component extracted from the leakage current. In addition, θ is a phase difference. The resistance component leakage current calculation unit 18 can accurately calculate a ground insulation resistance component leakage current by selecting this expression in step S9 in a case where the inverter 3 is not inserted. The insulation failure determination unit 20 calculates the ground insulation resistance of the three-phase motor 5 by dividing the R-S line voltage by the ground insulation resistance component leakage current. Thereby, it is possible to accurately calculate ground insulation resistance in a case where the inverter 3 is not inserted.

(Calculation Procedure in Case of Presence of Insertion of Inverter 3 and Inconsistency of Frequency)

A calculation procedure of a ground insulation resistance component leakage current which is selected in a case where the inverter 3 is inserted and the system frequency and the operating frequency are not coincident with each other is, for example, as follows.

Figure 8:
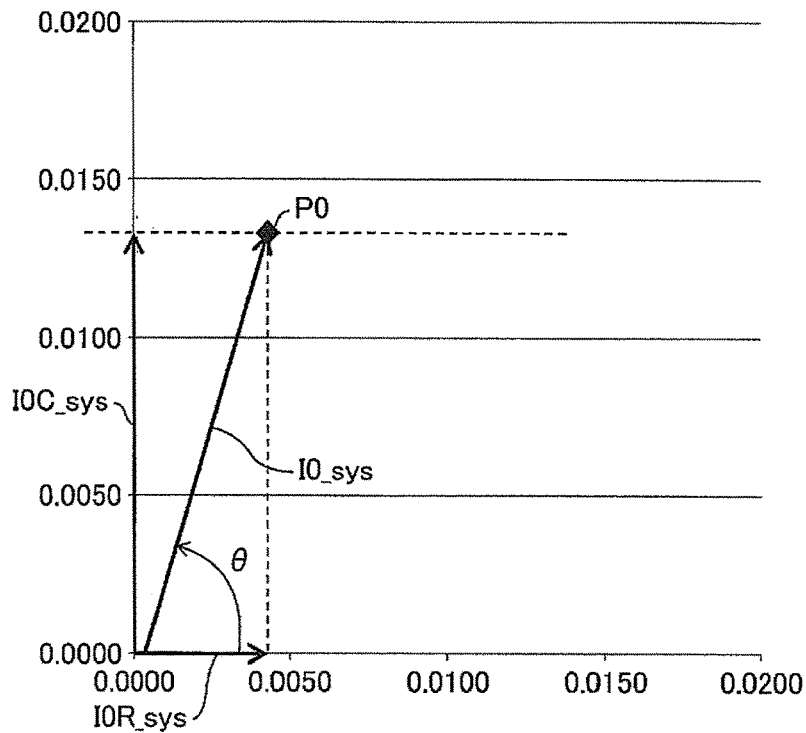
FIG. 8 is a diagram illustrating a principle for the leakage current calculation device according to Embodiment 1 of the disclosure to calculate a leakage current that is synchronized with the system frequency of the commercial power system in a case where the system frequency of the commercial power system and the operating frequency of the inverter are coincident with each other.
Figure 8:
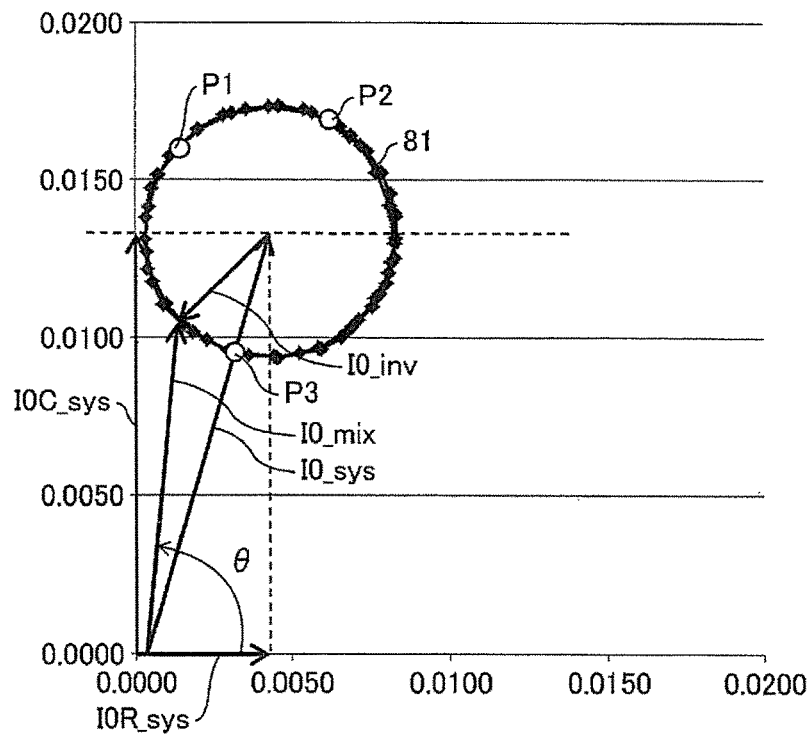

In the drawings, (a) of FIG. 8 is a diagram illustrating a principle for the leakage current calculation device 1 according to Embodiment 1 of the disclosure to calculate a leakage current that is synchronized with the system frequency of the commercial power system 2.

The leakage current I0 that is measured by the leakage current measurement unit 12 includes a component (I0_sys) that is synchronized with the system frequency of the commercial power system 2 and a component (I0_inv) that is synchronized with the operating frequency of the inverter 3. In order to calculate the ground insulation resistance of the three-phase motor 5, it is necessary to extract only the leakage current I0_sys that is a leakage current component synchronized with the system frequency from the leakage current I0.

In (a) of FIG. 8, the frequency (system frequency) of a voltage that is supplied to the inverter 3 by the commercial power system 2 is 60 Hz, and the frequency (operating frequency) of a voltage for the inverter 3 to drive the three-phase motor 5 is 50 Hz. That is, both frequency settings are different from each other.

In this case, the system frequency component extraction unit 14 extracts only the leakage current I0_sys of the system frequency component from the measured leakage current I0 by executing an arithmetic operation process of extracting a leakage current having the same frequency as the system frequency. Since the system frequency and the operating frequency are different from each other, in this extraction process, a component that is synchronized with the system frequency is extracted, but a component that is synchronized with the operating frequency is not extracted. Thereby, the extracted leakage current I0_sys does not include the leakage current I0_inv that is synchronized with the operating frequency component of the inverter 3.

The impedance between the three-phase motor 5 and the earth E includes both the ground insulation resistance and the ground floating capacitance. The ground voltage Vs∠180° is applied to both the ground insulation resistance and the ground floating capacitance, whereby the phase of the leakage current I0 to be measured is shifted from the phase of the ground voltage Vs∠180° due to the influence of the ground floating capacitance. Therefore, the phase difference θ of the leakage current I0_sys that is extracted from the leakage current I0 is also shifted from the phase of the ground voltage Vs∠180°.

As shown in (a) of FIG. 8, in a case where the system frequency and the operating frequency are different from each other, the leakage current component that is extracted from the leakage current I0 includes only the leakage current I0_sys. Therefore, the phase difference θ between the ground voltage Vs∠180° and the leakage current component (I0_sys itself) is always constant regardless of a point in time of measurement.

Therefore, as shown in (a) of FIG. 8, when a vector of the leakage current I0_sys is drawn with the origin in a plane coordinate system used as a starting point, and with the angle of a phase difference θ provided for the horizontal axis of this plane coordinate system, a terminal point P0 of this vector always concentrates on the same point regardless of a point in time at which the leakage current I0_sys is extracted. Thereby, a vector that links the origin of the plane coordinate system to a point at which the terminal point P0 is projected onto the horizontal axis of the plane coordinate system precisely corresponds to a resistance component leakage current I0R_sys of the system frequency component. That is, the value of this projection point is an effective value of I0R_sys. On the other hand, a vector that links the origin of the plane coordinate system to a point at which the terminal point P0 is projected onto the vertical axis of the plane coordinate system precisely corresponds to a capacitive component leakage current I0C_sys of the system frequency component. That is, the value of this projection point is an effective value of I0C_sys.

As described above, in a case where the system frequency of the commercial power system 2 and the operating frequency of the inverter 3 are different from each other, the leakage current calculation device 1 can precisely calculate the leakage current I0_sys of the system frequency portion by extracting a component that is synchronized with the system frequency from the measured leakage current I0. As a result, it is also possible to precisely calculate the ground insulation resistance of the three-phase motor 5 by using the ground voltage Vs∠180° and the leakage current I0R_sys.

(Calculation Procedure in Case of Presence of Insertion of Inverter 3 and Consistency of Frequency)

In a case where the inverter 3 is inserted, and the system frequency and the operating frequency are coincident with each other, the resistance component leakage current calculation unit 18 calculates a ground insulation resistance component leakage current on the basis of a series of calculation procedures to be described below.

(Calculation Principle of Leakage Current)

In the drawings, (b) of FIG. 8 is a diagram illustrating a principle for the leakage current calculation device 1 according to Embodiment 1 of the disclosure to calculate a leakage current that is synchronized with the system frequency of the commercial power system 2 in a case where the system frequency of the commercial power system 2 and the operating frequency of the inverter 3 are coincident with each other.

In a case where the inverter 3 is inserted between the commercial power system 2 and the three-phase motor 5, the leakage current I0 that is measured by the leakage current measurement unit 12 includes the component (I0_sys) that is synchronized with the system frequency of the commercial power system 2 and the component (I0_inv) that is synchronized with the operating frequency of the inverter 3. In order to calculate the ground insulation resistance of the three-phase motor 5, it is necessary to extract only the leakage current I0_sys that is a frequency component synchronized with the system frequency from the leakage current I0. As shown in (b) of FIG. 8, in a case where the system frequency of the commercial power system 2 and the operating frequency of the inverter 3 are coincident with each other, a terminal point of the leakage current I0 expressed using vector notation is not determined as one point, and has its position changed for each point in time of measurement. This is because both the leakage current I0_sys of the system frequency portion and the leakage current I0_inv of the operating frequency portion are included in the leakage current that is extracted by the frequency component extraction unit 14.

In a case where settings of the system frequency and the operating frequency are coincident with each other, the frequency component extraction unit 14 is not able to discriminate between a component that is synchronized with the system frequency included in the leakage current I0 and a component that is synchronized with the operating frequency. Therefore, when the frequency component extraction unit 14 executes a process of extracting a component that is synchronized with the system frequency from the leakage current I0, a leakage current I0_mix in which the leakage current I0_sys synchronized with the system frequency and the leakage current I0_inv synchronized with the operating frequency are mixed is extracted as a result.

In this case, as shown in (b) of FIG. 8, the vector drawn on the plane coordinate system is a resultant vector (a vector of I0_mix) of the vector of I0_sys and the vector of I0_inv. Although this will be described later in detail, the position of a terminal point of this resultant vector changes for each point in time of measurement like a point P1 (a specific point), a point P2 (a specific point), a point P3 (a specific point), and the like due to the influence of I0_inv. Specifically, as shown in (b) of FIG. 8, this change is generated as if a circle 81 is drawn by each terminal point.

Therefore, in a case where the system frequency and the operating frequency are coincident with each other, the terminal point of the vector is not determined as one point unlike (a) of FIG. 8, whereby it is not possible to precisely calculate the resistance component leakage current I0R_sys of the system frequency component on the basis of this terminal point. In other words, even when I0R_sys is calculated on the basis of the terminal point, the value fluctuates for each point in time of measurement, whereby it is not possible to specify a correct value.

(Reason for Drawing Circle)

Figure 9:
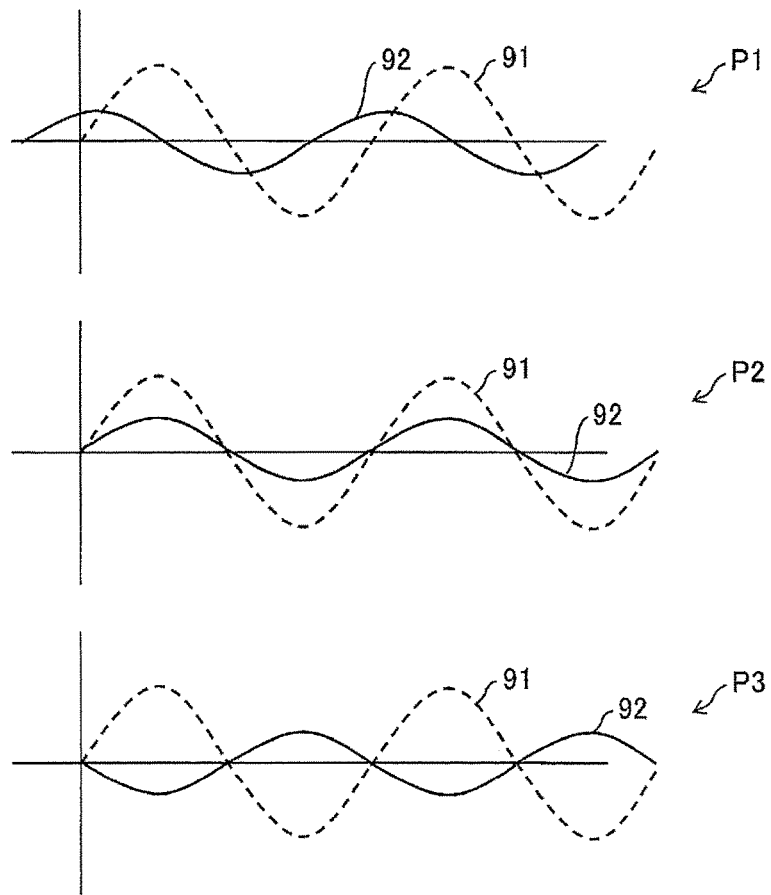
FIG. 9 is a diagram illustrating a principle in which a terminal point of an extracted leakage current expressed using vector notation is rotated, in Embodiment 1 of the disclosure, in a case where the system frequency and the operating frequency are coincident with each other.
Figure 9:
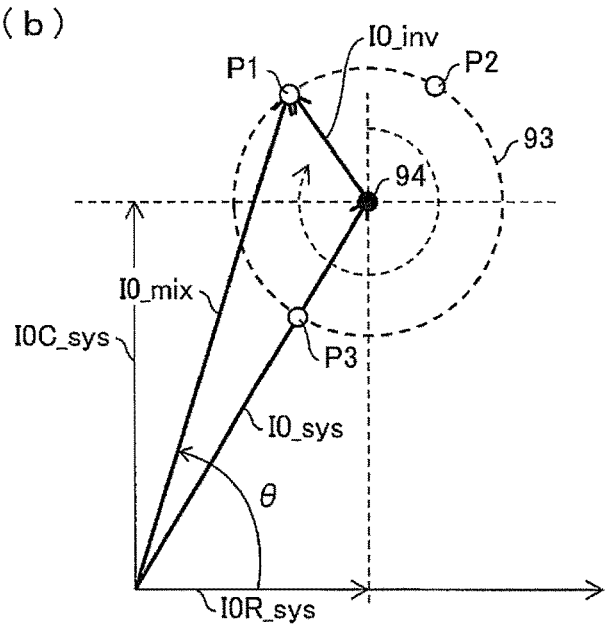

FIG. 9 is a diagram illustrating a principle in which a terminal point of an extracted frequency component expressed using vector notation is rotated, Embodiment 1 of the disclosure, in a case where the system frequency and the operating frequency are coincident with each other.

Even if the system frequency and the operating frequency are set to have the same value, the frequencies are strictly slightly different from each other. For example, even in a case where each of the frequencies is set to 60 Hz, a slight shift therebetween occurs as if the system frequency is 60.00 Hz, while the operating frequency is 60.01 Hz. As shown in (a) of FIG. 9, because of a shift between the frequencies, a waveform 91 of I0_sys and a waveform 92 of I0_inv are shifted therebetween bit by bit as a point in time of measurement gradually changes to P1, P2, and P3.

As described above, in a case where the system frequency and the operating frequency are coincident with each other, the leakage current I0_mix extracted from the leakage current I0 includes the leakage current I0_sys of the system frequency portion and the leakage current I0_inv of the operating frequency portion. In this case, since the phase difference 8 to be decided is a phase difference between the ground voltage Vs∠180° and the leakage current I0_mix, a shift occurs between the waveform of I0_sys included in the leakage current I0_inv and the waveform of I0_inv, whereby the value of the phase difference θ is shifted with a time. Thereby, the position of a terminal point of the leakage current I0_mix expressed using vector notation changes with a time. For example, the positions of the terminal points (specific points) P1 to P3 of the leakage current I0 change in response to shifts of the waveforms of P1 to P3 in (a) of FIG. 9. With a temporal change in the phase difference θ due to this change, the terminal point of I0_mix draws a circle 93 with a time as shown in (b) of FIG. 9. That is, P1 to P3 are plotted on the circle 93 in principle.

The terminal point of I0_sys is coincident with a central point 94 of the circle 93. Therefore, the leakage current calculation device 1 of the present embodiment calculates this central point 94, and precisely calculates I0R_sys and I0C_inv by further projecting the central point 94 onto the horizontal axis and the vertical axis of the plane coordinate axis.

There are various methods of calculating the central point of a circle that is drawn by the terminal point of the leakage current I0_mix. Hereinafter, three methods among them will be described.

(First Method)

Figure 10:
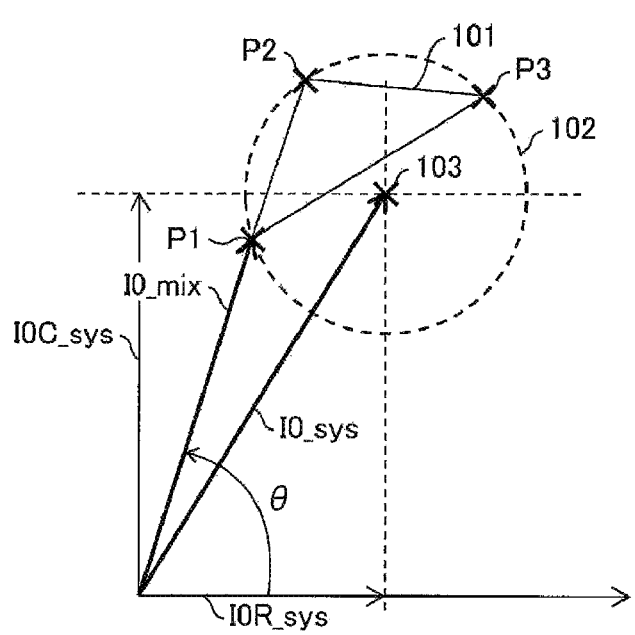
FIG. 10 is a diagram illustrating a first method for calculating a ground insulation resistance component leakage current in Embodiment 1 of the disclosure.

FIG. 10 is a diagram illustrating a first method for calculating a ground insulation resistance component leakage current in Embodiment 1 of the disclosure in a case where the system frequency and the operating frequency are coincident with each other.

In the example of FIG. 10, the frequency component extraction unit 14 extracts I0_mix at three different points in time. Similarly, the phase difference calculation unit 15 calculates the phase difference θ at three different points in time. Thereby, the circle center calculation unit 17 calculates the points P1 to P3 that are terminal points of each I0_mix expressed using vector notation on the basis of the leakage current I0_mix and the phase difference θ that are decided at three points in time.

The circle center calculation unit 17 calculates the circumcenter of a triangle 101 with vertices at the points P1 to P3 instead of directly calculating a circle 102 passing through the points. This circumcenter is coincident with a central point 103 of the circle 102 that is circumscribed about the triangle 101. In this manner, in the example of FIG. 10, the circle center calculation unit 17 can calculate the central point 103 of the circle 102 passing through the points P1 to P3 by calculating the circumcenter of the triangle 101 with vertices at the points.

The circle center calculation unit 17 outputs the calculated central point 103 to the resistance component leakage current calculation unit 18. As shown in FIG. 10, the vector in which the origin of the plane coordinate system is used as a starting point and the central point 103 is used as a terminal point is none other than the leakage current I0_sys of the system frequency portion in the leakage current I0_mix extracted from the leakage current I0. Consequently, the resistance component leakage current calculation unit 18 can calculate the ground insulation resistance component leakage current I0R_sys in the leakage current I0_sys of the system frequency portion by projecting the calculated central point 103 onto the horizontal axis.

The resistance component leakage current calculation unit 18 outputs calculated I0R_sys to the insulation resistance calculation unit 19. The insulation resistance calculation unit 19 calculates the ground insulation resistance of the three-phase motor 5 using the leakage current I0R_sys and the ground voltage Vs∠180°.

In this method, the central point 103 is calculated using only the three points P1 to P3. That is, since it may be sufficient to measure the leakage current I0 at three different points in time in order to calculate I0R_sys, it is possible to calculate I0R_sys at high speed.

(Second Method)

Figure 11:
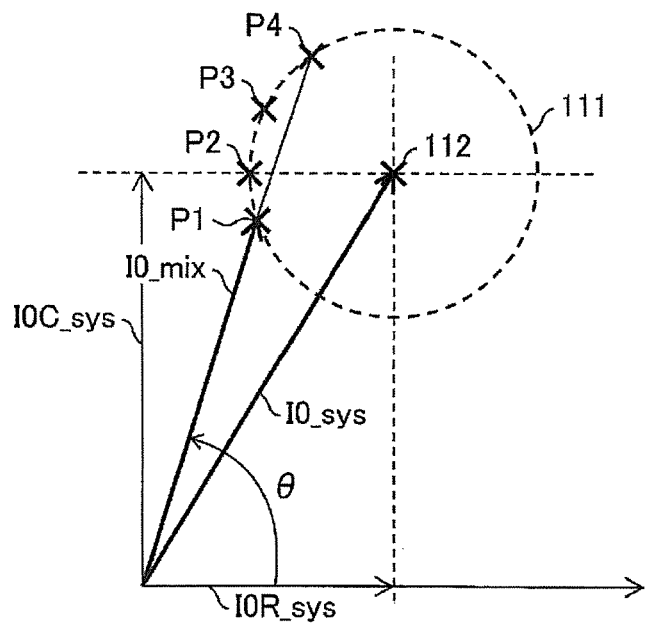
FIG. 11 is a diagram illustrating a second method for calculating a ground insulation resistance component leakage current in Embodiment 1 of the disclosure.
Figure 11:
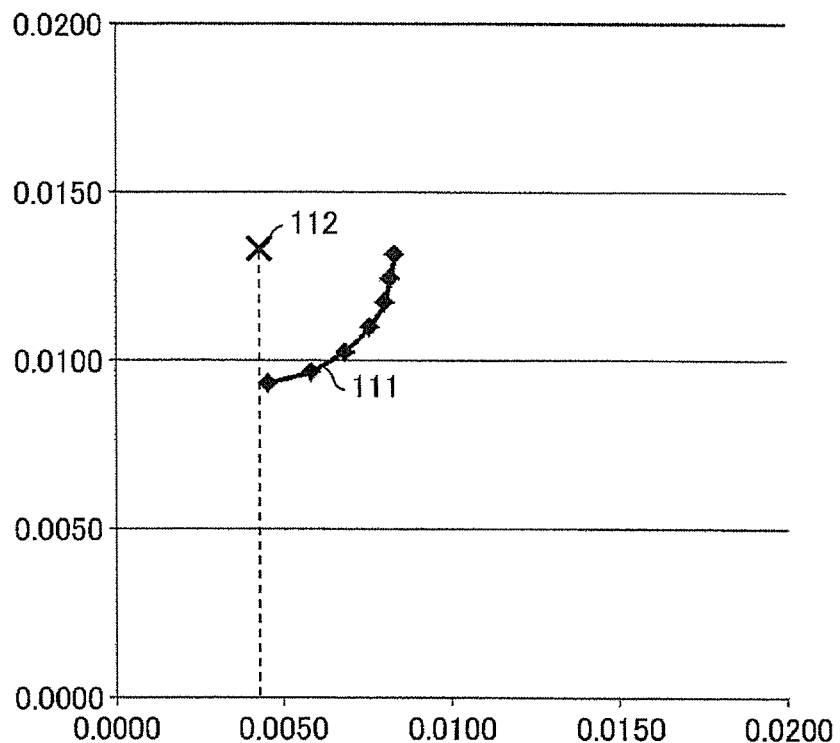

FIG. 11 is a diagram illustrating a second method for calculating a ground insulation resistance component leakage current in Embodiment 1 of the disclosure in a case where the system frequency and the operating frequency are coincident with each other.

In the example of FIG. 11, the frequency component extraction unit 14 extracts IO mix at four or more different points in time. Similarly, the phase difference calculation unit 15 calculates the phase difference θ at four or more different points in time. Thereby, the circle center calculation unit 17 calculates each point Pn (n=1, 2, 3, 4, . . . ) that is a terminal point of each I0_mix expressed using vector notation on the basis of the leakage current I0_mix and the phase difference θ that are decided at four or more point in time.

The circle center calculation unit 17 calculates the equation of a circle 111 passing through each of the points Pn. A central point 112 of the circle 111 is calculated using this equation. In the example of FIG. 11, the circle center calculation unit 17 calculates the equation of the circle 111 using a least squares method of the circle using each of the calculated points Pn. Hereinafter, a detailed description will be given.

Figure 12:
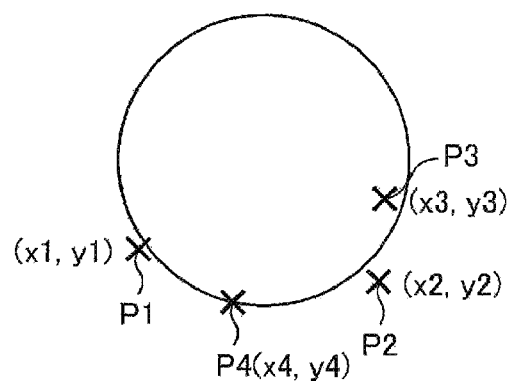
FIG. 12 is a diagram illustrating a least squares method of a circle in Embodiment 1 of the disclosure.

FIG. 12 is a diagram illustrating a least squares method of a circle in Embodiment 1 of the disclosure. As shown in this drawing, each of the points Pn is assumed to be calculated as a point P1 (x1, y1), a point P2 (x2, y2), a point P3 (x3, y3), a point P4 (x4, y4), . . . . In the present embodiment, the equation of the circle 111 approximating these points is defined as $(x-a)^2 \times (y-b)^2 = r^2$, and coefficients a, b, and r for the sum of squares E of errors between these points and $(x-a)^2 \times (y-b)^2 = r^2$ to be minimized are calculated by the least squares method.

An error E is specified by $E = \Sigma((x-a)^2 \times (y-b)^2 = r^2)$. However, when the error E is calculated using this expression, a, b, and r are all becomes a quartic function, which results in very complicated calculation. Consequently, first, a relational expression in which a, b, and r are replaced by parameters A, B, and C is obtained as follows.

$$E = \Sigma(x^2 + y^2 + Ax + By + C)$$

Here, relations of A=−2a, B=−2b, and C=a²+b²−r² are established. When this relational expression is differentiated partially, the following expression is obtained.

$$\begin{cases} \partial/\partial A = A\sum x^2 + B\sum xy + C\sum x + \sum x^3 + \sum xy^2 = 0 \\ \partial/\partial B = A\sum xy + B\sum y^2 + C\sum y + \sum x^2y + \sum y^3 = 0 \\ \partial/\partial C = A\sum x + B\sum y + C\sum 1 + \sum x^2 + \sum y^2 = 0 \end{cases}$$ [Expression 1]

When these expressions are solved by a matrix operation, the following determinant is obtained.

$$\begin{pmatrix} \sum x^2 & \sum xy & \sum x \\ \sum xy & \sum y^2 & \sum y \\ \sum x & \sum y & \sum 1 \end{pmatrix} \begin{pmatrix} A \\ B \\ C \end{pmatrix} = \begin{pmatrix} -\sum(x^3 + xy^2) \\ -\sum(x^2y + y^3) \\ -\sum(x^2 + y^2) \end{pmatrix}$$ [Expression 2]

When this determinant is developed, the following determinant is obtained.

$$\begin{pmatrix} A \\ B \\ C \end{pmatrix} = \begin{pmatrix} \sum x^2 & \sum xy & \sum x \\ \sum xy & \sum y^2 & \sum y \\ \sum x & \sum y & \sum 1 \end{pmatrix}^{-1} \begin{pmatrix} -\sum(x^3 + xy^2) \\ -\sum(x^2y + y^3) \\ -\sum(x^2 + y^2) \end{pmatrix}$$ [Expression 3]

The parameters A, B, and C are decided by solving this determinant. The coefficients a, b, and r can be decided by substituting the decided parameters A, B, and C into the above-described relational expression. Thereby, since the equation of the circle 111 is calculated, the central point 112 is calculated using this equation. The calculation of the ground insulation resistance component leakage current I0_sys based on the central point 112 and the calculation of the ground insulation resistance of the three-phase motor 5 based on the leakage current I0_sys and the ground voltage Vs∠180° are no different than the above-described example.

In this method, since the least squares method of a circle is used in the calculation of the circle 111, it is possible to precisely calculate the central point 112 of the circle 111. Therefore, it is possible to precisely calculate the leakage current I0_sys and the ground insulation resistance.

An example of the actual calculation result of I0_sys is shown in (b) of FIG. 11. In this example, (x−0.0044)²+(y−0.0133)²=0.0039² is calculated as the equation of the circle 111. When the central point 112 that is decided from this equation is projected onto the horizontal axis, the value is set to 4.4 mA, and thus 4.4 mA is calculated as I0R_sys. Since the theoretical value of I0_sys in the three-phase motor 5 using this calculation is 4.3 mA, it can be understood that the calculation result is well coincident with the theoretical value. In addition, the ground insulation resistance of the three-phase motor 5 calculated using I0_sys of 4.4 mA is 26.9 kΩ, and this is also well coincident with 27 kΩ that is a theoretical value.

(Third Method)

Figure 13:
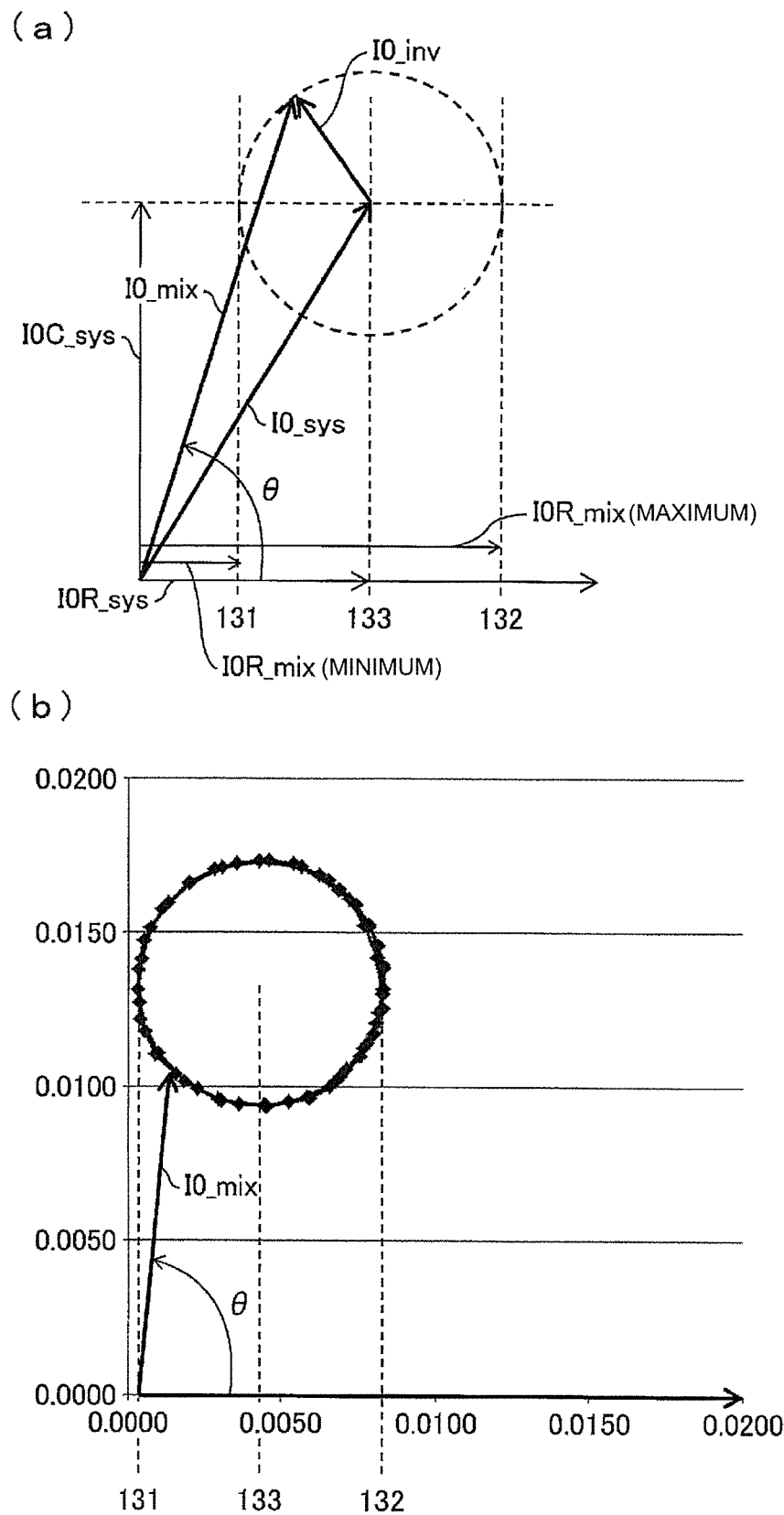
FIG. 13 is a diagram illustrating a third method for calculating a ground insulation resistance component leakage current in Embodiment 1 of the disclosure.

FIG. 13 is a diagram illustrating a third method for calculating a ground insulation resistance component leakage current in Embodiment 1 of the disclosure in a case where the system frequency and the operating frequency are coincident with each other.

In the example of FIG. 13, the frequency component extraction unit 14 does not directly calculate the central point of a circle, instead calculates the minimum value of the ground insulation resistance component leakage current in I0_mix and the maximum value of the ground insulation resistance component leakage current in I0_mix within a certain period of time, and calculates an intermediate value between the values as I0R_sys.

In this method, the frequency component extraction unit 14 extracts I0_mix at each point in time over within a certain period of time (a long time more than 60 seconds is preferable), that is, until points of the circumference or more of a circle are calculated.

Similarly, the phase difference calculation unit 15 calculates the phase difference θ at each point in time until points of the circumference or more of a circle are calculated. In this method, the circle center calculation unit 17 does not calculate the center of a circle. Instead, the insulation resistance calculation unit 19 calculates a ground insulation resistance component leakage current I0R_mix in the leakage current I0_mix at each point in time using the leakage current I0_mix and the phase difference θ which are obtained at each point in time. This is obtained by multiplying I0_mix by cos θ. That is, a relation of I0R_mix=I0_mix×cos θ is established.

The insulation resistance calculation unit 19 executes the calculation of I0R_mix at each point in time over a long time (more than 60 seconds). The value of I0R_mix is coincident with the value of the horizontal axis at a point where a terminal point of I0_mix expressed using vector notation is projected onto the horizontal axis. Since this terminal point draws a circle as described above, the point where the terminal point is projected onto the horizontal axis is located within a line obtained by projecting the entire circle onto the horizontal axis. Therefore, a minimum value 131 and a maximum value 132 corresponding to each end of a line are determined in I0R_mix to be calculated.

Since the minimum value 131 and the maximum value 132 correspond to each end in a horizontal axis direction in a circle that is drawn by the terminal point of I0_mix, the intermediate value 133 between the minimum value 131 and the maximum value 132 corresponds to the central point of the circle. As described above, since the value obtained by projecting the central point of the circle onto the horizontal axis corresponds to I0R_sys, the resistance component leakage current calculation unit 18 can calculate I0R_sys by calculating the intermediate value 133.

Meanwhile, the calculation of the ground insulation resistance of the three-phase motor 5 based on I0R_sys and the ground voltage Vs∠180° is no different than the above-described example.

In this method, since the center of a circle is not required to be obtained using a complicated equation in order to calculate I0R_sys, it is possible to obtain I0R_sys through simple calculation.

An example of the actual calculation result of I0R_sys based on the third method shown in (b) of FIG. 13. In this example, 4.3 mA is calculated as the intermediate value 133, that is, I0R_sys. The ground insulation resistance of the three-phase motor 5 calculated using I0R_sys of 4.3 mA is 27.1 kΩ, and this is well coincident with 27 kΩ which is a theoretical value.

(Advantage of the Present Embodiment)

As described above, the leakage current calculation device 1 determines whether the inverter 3 is inserted between the commercial power system 2 and the three-phase motor 5. The leakage current calculation device 1 further calculates the ground insulation resistance component leakage current of the system frequency portion that flows between the three-phase motor 5 and the earth E through the ground insulation resistance of the three-phase motor 5 on the basis of the calculation procedure corresponding to the result of determination. Specifically, in a case where the inverter 3 is not inserted, the leakage current calculation device 1 calculates the ground insulation resistance component leakage current on the basis of the calculation procedure corresponding thereto. On the other hand, in a case where the inverter 3 is inserted, the ground insulation resistance component leakage current is calculated on the basis of the calculation procedure corresponding thereto. Therefore, even in a case where the inverter 3 is present in a facility or is not present, the presence of the leakage current calculation device 1 is sufficient to calculate the ground insulation resistance component leakage current. In other words, a device for measuring the ground insulation resistance component leakage current is not required except the leakage current calculation device 1. Therefore, the leakage current calculation device 1 according to the present embodiment can precisely calculate the ground insulation resistance component leakage current regardless of the presence or absence of an inverter.

Embodiment 2

Embodiment 2 according to the disclosure will be described below with reference to FIG. 14 and FIG. 15. Common members with respect to those in Embodiment 1 described above are denoted by the same reference numerals and signs, and thus the detailed description thereof will not be given.

(Schematic Configuration)

Figure 14:
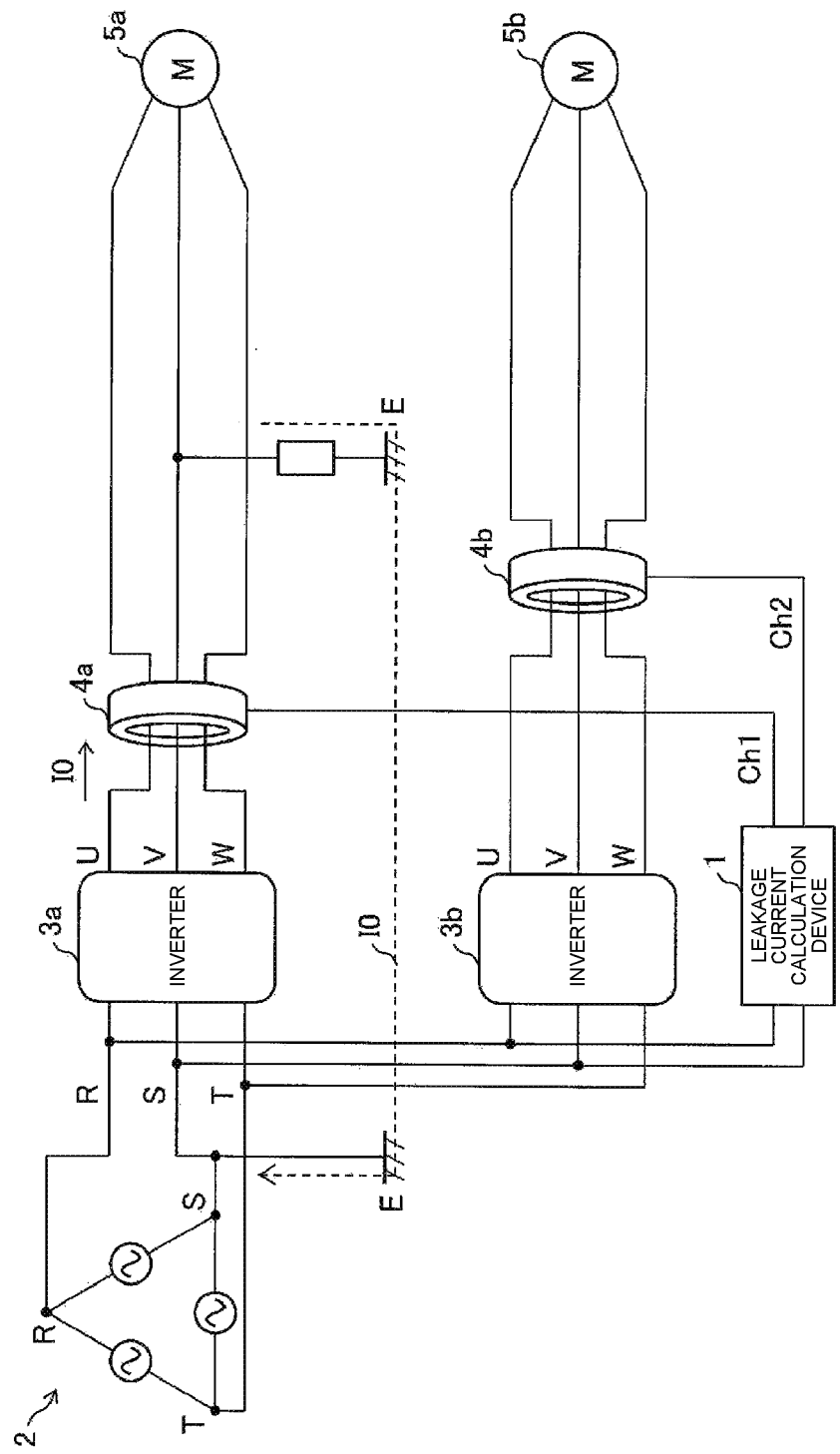
FIG. 14 is an outline system diagram illustrating a configuration example to which a leakage current calculation device according to Embodiment 2 of the disclosure is applied.

FIG. 14 is an outline system diagram illustrating a configuration example to which a leakage current calculation device 1 according to Embodiment 2 of the disclosure is applied. In the present embodiment, the configuration of the leakage current calculation device 1 is basically the same as that of Embodiment 1. However, in the present embodiment, as shown in FIG. 14, one leakage current calculation device 1 can be configured to monitor each of a plurality of three-phase motors 5a and 5b.

The three-phase motors 5a and 5b are driven by inverters 3a and 3b, respectively. All the input sides of the inverters 3a and 3b are connected to the common commercial power system 2. The output side of the inverter 3a is connected to the three-phase motor 5a, while the output side of the inverter 3b is connected to the three-phase motor 5b.

In addition, a zero-phase current transformer 4a is disposed between the inverter 3a and the three-phase motor 5a, while a zero-phase current transformer 4b is disposed between the inverter 3b and the three-phase motor 5b. Both the zero-phase current transformers 4a and 4b are connected to the leakage current measurement unit 12 of the leakage current calculation device 1.

(Calculation Procedure)

In the present embodiment, the leakage current calculation device 1 calculates a ground insulation resistance component leakage current and ground insulation resistance corresponding to the three-phase motors 5a and 5b, respectively. The procedure will be described below.

The voltage measurement unit 11 measures at least one of line voltages on one input side of a plurality of inverters 3a and 3b. Since the input side of each of the inverters 3a and 3b is connected to the common commercial power system 2, for example, the voltage Vrs of the inverter 3a between the R-phase and the S-phase is completely equal to the voltage Vrs of the inverter 3b between the R-phase and the S-phase. In this manner, in the present embodiment, since the voltage Vrs may be measured at only one point, it is possible to further simplify the configuration of the leakage current calculation device 1.

The ground voltage calculation unit 13 calculates the ground voltage $Vs\angle 180°$ on the basis of the voltage Vrs measured from the input side of the inverter 3a. Since the voltage Vrs is common to the inverters 3a and 3b, the leakage current calculation device 1 uses the voltage $Vs\angle 180°$ in the following process as a ground voltage common to the three-phase motor 5a and the three-phase motor 5b.

The leakage current measurement unit 12 measures the leakage current of the three-phase motor 5a through the zero-phase current transformer 4a, and measures the leakage current of the three-phase motor 5b through the zero-phase current transformer 4b. That is, the leakage current calculation device 1 includes one leakage current measurement unit 12 common to the three-phase motors 5a and 5b.

Meanwhile, the leakage current calculation device 1 may include a plurality of leakage current measurement units 12a and 12b corresponding to the three-phase motors 5a and 5b, respectively. In this configuration, the leakage current measurement unit 12a is connected to the zero-phase current transformer 4a, while the leakage current measurement unit 12b is connected to the zero-phase current transformer 4b. The leakage current measurement unit 12a measures the leakage current of the three-phase motor 5a through the zero-phase current transformer 4a, while the leakage current measurement unit 12b measures the leakage current of the three-phase motor 5b through the zero-phase current transformer 4b.

The frequency component extraction unit 14 extracts a frequency component corresponding to the three-phase motor 5a from the leakage current of the three-phase motor 5a. On the other hand, a frequency component corresponding to the three-phase motor 5b is extracted from the leakage current of the three-phase motor 5b.

The phase difference calculation unit 15 calculates a phase difference between the calculated ground voltage and the frequency component of the three-phase motor 5a. Further, a phase difference between the calculated ground voltage and the frequency component of the three-phase motor 5b is calculated.

The resistance component leakage current calculation unit 18 calculates the ground insulation resistance component leakage current of the three-phase motor 5a on the basis of the central point of a circle corresponding to the three-phase motor 5a. In addition, the ground insulation resistance component leakage current of the three-phase motor 5b is calculated on the basis of the central point of a circle corresponding to the three-phase motor 5b.

The insulation resistance calculation unit 19 calculates the ground insulation resistance of the three-phase motor 5a from the ground voltage $Vs\angle 180°$ and the ground insulation resistance component leakage current of the three-phase motor 5a. In addition, the ground insulation resistance of the three-phase motor 5b is calculated from the ground voltage $Vs\angle 180°$ and the ground insulation resistance component leakage current of the three-phase motor 5b.

Figure 15:
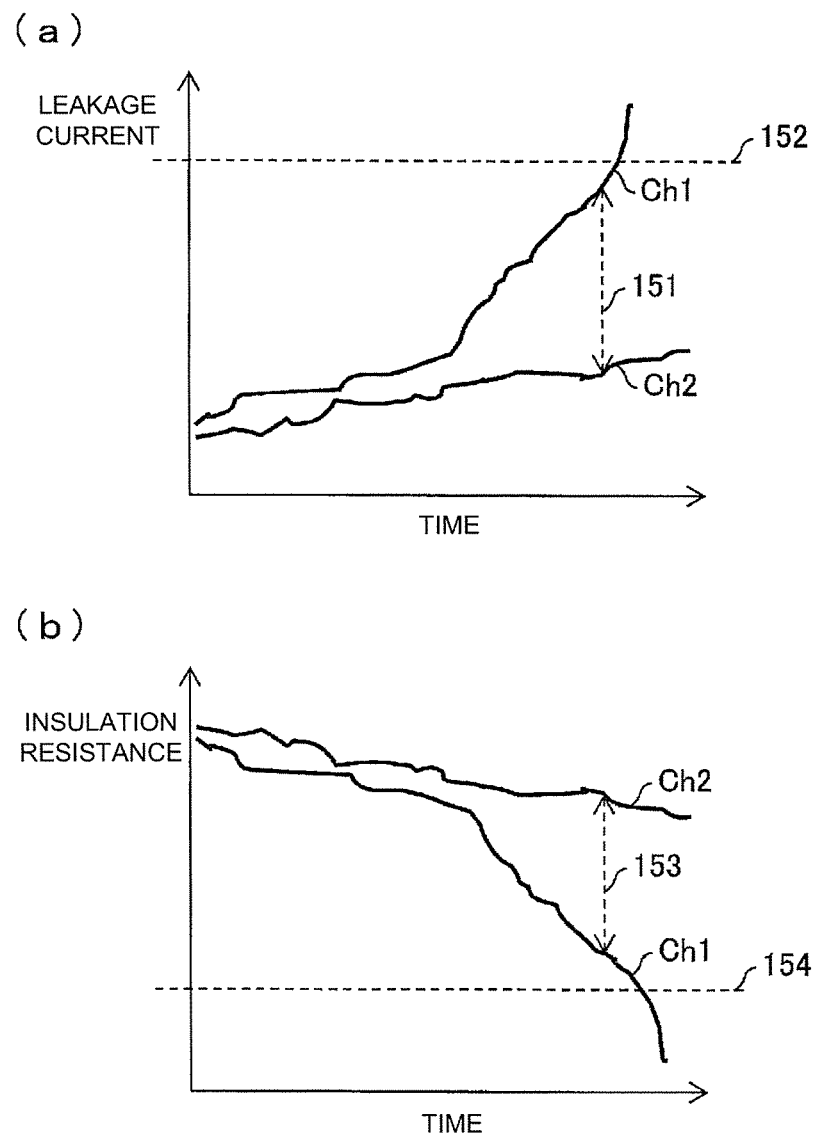
FIG. 15 is a diagram illustrating an example of temporal transition of a calculation value of a ground insulation resistance component leakage current or ground insulation resistance for each three-phase motor in Embodiment 2 of the disclosure.

FIG. 15 is a diagram illustrating an example of temporal transition of a calculation value of a ground insulation resistance component leakage current or ground insulation resistance for each three-phase motor 5 in Embodiment 2 of the disclosure. In addition, (a) of FIG. 15 shows temporal transition of the ground insulation resistance component leakage current of each of the three-phase motors 5a and 5b. In the drawing, Ch1 corresponds to the three-phase motor 5a, and Ch2 corresponds to the three-phase motor 5b. On the other hand, (b) of FIG. 15 shows temporal transition of the ground insulation resistance of each of the three-phase motors 5a and 5b. In the drawing, Ch1 corresponds to the three-phase motor 5a, and Ch2 corresponds to the three-phase motor 5b. In the drawings, the temporal variations of the ground insulation resistance component leakage current or the ground insulation resistance are different from each other in the three-phase motors 5a and 5b. The leakage current calculation device 1 can appropriately specify a three-phase motor 5 which is in the state of insulation deterioration by comparing mutual values or comparing each value with a predetermined threshold.

(Determination Based on Degree of Deviation)

The insulation failure determination unit 20 can determine the degree of insulation deterioration in each of the three-phase motors 5a and 5b by comparing the ground insulation resistance component leakage current of the system frequency portion of the three-phase motor 5a with the ground insulation resistance component leakage current of the system frequency portion of the three-phase motor 5b. For example, in the example of (a) of FIG. 15, a large degree of deviation 151 occurs between the ground insulation resistance component leakage current of the system frequency portion of the three-phase motor 5a at a certain point in time and the ground insulation resistance component leakage current of the system frequency portion of the three-phase motor 5b at the same point in time. In a case where this degree of deviation 151 is detected, the insulation failure determination unit 20 determines that the three-phase motor 5a having a larger ground insulation resistance component leakage current is in the state of insulation deterioration.

(Determination Based on Threshold)

The insulation failure determination unit 20 can also specify a three-phase motor 5 in which a corresponding ground insulation resistance component leakage current out of the three-phase motors 5a and 5b exceeds a prescribed threshold as the three-phase motor 5a which is in the state of insulation deteriorate. For example, in (a) of FIG. 15, since the ground insulation resistance component leakage current of the three-phase motor 5a exceeds a threshold 152 from a certain point in time onward, the insulation failure determination unit 20 can specify that the three-phase motor 5a is in the state of insulation deterioration from this point in time onward.

Meanwhile, the determination using the degree of deviation or the threshold described above can also be performed with respect to not only the ground insulation resistance component leakage current, but also the ground insulation resistance of the three-phase motors 5a and 5b as shown in (b) of FIG. 15. For example, in (b) of FIG. 15, a large degree of deviation 153 occurs between the ground insulation resistance of the three-phase motor 5a at a certain point in time and the ground insulation resistance of the three-phase motor 5b at the same point in time. In a case where this degree of deviation 153 is detected, the insulation failure determination unit 20 determines that the three-phase motor 5a having a smaller ground insulation resistance is in the state of insulation deterioration. In addition, in (b) of FIG. 15, since the ground insulation resistance of the three-phase motor 5a falls below a threshold 154 from a certain point in time onward, the insulation failure determination unit 20 can specify that the three-phase motor 5a is in the state of insulation deterioration from this point in time onward.

(Modification Example)

In a configuration in which the leakage current calculation device 1 includes a plurality of leakage current measurement units 12, the leakage current measurement units 12 for measuring the leakage current of the three-phase motor 5 that is not a target for monitoring are unnecessary. The leakage current calculation device 1 including such unnecessary leakage current measurement units 12 leads to a useless increase in the cost of the leakage current calculation device 1.

In order to prevent this, each of the leakage current measurement units 12 may be an extension unit for measuring a leakage current. In this case, since as many leakage current measurement units 12 as necessary are mounted in the leakage current calculation device 1, or unnecessary leakage current measurement units 12 can be removed from the leakage current calculation device 1, it is possible to suppress the cost of the leakage current calculation device 1. Meanwhile, in order to realize the leakage current measurement unit 12 as such an extension unit, for example, a technique disclosed in Japanese Patent Laid-Open No. 2013-181813 may be used.

(Conclusion)

According to a first aspect of the disclosure, in order to solve the above problem, there is provided a leakage current calculation device including: a voltage measurement unit that measures at least one of line voltages in a three-phase AC type commercial power system to which one of three different phases is grounded; a ground voltage calculation unit that calculates a ground voltage between a neutral point and an earth of the commercial power system from the at least one line voltage measured by the voltage measurement unit; a leakage current measurement unit that measures a leakage current that flows between a load connected to the commercial power system and the earth; a frequency component extraction unit that extracts a frequency component that is synchronized with a system frequency of the commercial power system from the measured leakage current; a phase difference decision unit that decides a phase difference between the calculated ground voltage and the extracted frequency component; an insertion determination unit that determines whether an inverter is inserted between the commercial power system and the load; and a leakage current calculation unit that calculates a ground insulation resistance component leakage current of the system frequency portion that flows between the load and the earth through ground insulation resistance of the load on the basis of a calculation procedure corresponding to a result of determination of the insertion determination unit.

According to the above configuration, the leakage current calculation device determines whether the inverter is inserted between the commercial power system and the load. The leakage current calculation device further calculates the ground insulation resistance component leakage current of the system frequency portion that flows between the load and the earth through the ground insulation resistance of the load on the basis of a calculation procedure corresponding to a result of determination. Specifically, in a case where the inverter is not inserted, the leakage current calculation device calculates the ground insulation resistance component leakage current on the basis of the calculation procedure corresponding thereto. On the other hand, in a case where the inverter is inserted, the ground insulation resistance component leakage current is calculated on the basis of the calculation procedure corresponding thereto. Therefore, even in a case where the inverter is present in a facility or is not present, the presence of the leakage current calculation device is sufficient to calculate the ground insulation resistance component leakage current. In other words, a device for measuring the ground insulation resistance component leakage current is not required except the leakage current calculation device.

As described above, the leakage current calculation device according to the first aspect of the disclosure can precisely calculate the ground insulation resistance component leakage current regardless of the presence or absence of an inverter.

In the leakage current calculation device according to a second aspect of the disclosure in the first aspect, the insertion determination unit determines whether the inverter is inserted on the basis of input from the outside of the leakage current calculation device.

According to the above configuration, it is possible to accurately determine whether the inverter is inserted.

In the leakage current calculation device according to a third aspect of the disclosure in the first aspect, the insertion determination unit automatically determines whether the inverter is inserted.

According to the above configuration, it is possible to determine whether the inverter is inserted without a user spending much time or effort to use the leakage current calculation device.

In the leakage current calculation device according to a fourth aspect of the disclosure in the third aspect, the insertion determination unit determines whether the inverter is inserted on the basis of the leakage current measured at any given time and a change of the phase difference decided, and the frequency component extracted from the leakage current.

According to the above configuration, it is possible to accurately determine whether an inverter is inserted.

According to a fifth aspect of the disclosure, in order to solve the above problem, there is provided a leakage current calculation method including: a voltage measurement step of measuring at least one of line voltages in a three-phase AC type commercial power system to which one of three different phases is grounded; a ground voltage calculation step of calculating a ground voltage between a neutral point and an earth of the commercial power system from the measured at least one line voltage; a leakage current measurement step of measuring a leakage current that flows between a load connected to the commercial power system and the earth; a frequency component extraction step of extracting a frequency component that is synchronized with a system frequency of the commercial power system from the measured leakage current; a phase difference decision step of deciding a phase difference between the calculated ground voltage and the extracted frequency component; an insertion determination step of determining whether an inverter is inserted between the commercial power system and the load; and a leakage current calculation step of calculating a ground insulation resistance component leakage current of the system frequency portion that flows between the load and the earth through ground insulation resistance of the load on the basis of a calculation procedure corresponding to a result of determination in the insertion determination step.

According to the above configuration, it is possible to precisely calculate a ground insulation resistance component leakage current regardless of the presence or absence of an inverter.

The disclosure is not limited to each of embodiments described above, and can be changed variously in the scope shown in the claims. Embodiments obtained by appropriately combining technical means disclosed in each of the different embodiments are also included in the technical scope of the disclosure. A new technical feature can be formed by combining technical means disclosed in each of the embodiments.

What is claimed is:

1. A leakage current calculation method comprising:
   a voltage measurement step of measuring at least one of line voltages in a three-phase AC type commercial power system to which one of three different phases is grounded;
   a ground voltage calculation step of calculating a ground voltage between a neutral point and an earth of the commercial power system from the measured at least one line voltage;
   a leakage current measurement step of measuring a leakage current that flows between a load connected to the commercial power system and the earth;
   a frequency component extraction step of extracting a frequency component that is synchronized with a system frequency of the commercial power system from the measured leakage current;
   a phase difference decision step of deciding a phase difference between the calculated ground voltage and the extracted frequency component;
   an insertion determination step of determining whether an inverter is inserted between the commercial power system and the load; and
   a leakage current calculation step of calculating a ground insulation resistance component leakage current of a system frequency portion that flows between the load and the earth through a ground insulation resistance of the load on the basis of a calculation procedure corresponding to a result of determination in the insertion determination step.

2. The leakage current calculation method according to claim 1, wherein whether the inverter is inserted is determined in the insertion determination step on the basis of an input from an outside.

3. The leakage current calculation method according to claim 1, wherein whether the inverter is inserted is automatically determined in the insertion determination step.

4. The leakage current calculation method according to claim 3, wherein whether the inverter is inserted is determined in the insertion determination step on the basis of the leakage current measured at any given time and a change of the phase difference decided and the frequency component extracted from the leakage current.

* * * * *